(12) United States Patent
Darolia et al.

(10) Patent No.: US 8,083,124 B1
(45) Date of Patent: Dec. 27, 2011

(54) METHOD FOR JOINING SINGLE CRYSTAL MEMBERS AND IMPROVED FOIL THEREFOR

(75) Inventors: Ramgopal Darolia, West Chester, OH (US); Warren Davis Grossklaus, Jr., West Chester, OH (US); Murray Sawyer Smith, Cincinnati, OH (US); David Michael Matey, Muskegon, MI (US); Paul Wencil Stanek, Los Alamos, NM (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 07/615,553

(22) Filed: Nov. 19, 1990

(51) Int. Cl.
| | |
|---|---|
| *B23K 1/00* | (2006.01) |
| *B23K 5/00* | (2006.01) |
| *B23K 20/26* | (2006.01) |
| *B23K 20/00* | (2006.01) |
| *B23K 23/00* | (2006.01) |

(52) U.S. Cl. .......................... 228/194; 228/195; 228/57

(58) Field of Classification Search ............... 228/194, 228/195, 57
See application file for complete search history.

(56) References Cited

U.S. PATENT DOCUMENTS

| | | | | |
|---|---|---|---|---|
| 3,859,144 | A | * | 1/1975 | Basche et al. ............... 228/194 |
| 4,038,041 | A | * | 7/1977 | Duvall et al. ............... 228/194 |
| 4,122,992 | A | * | 10/1978 | Duvall et al. ............... 228/194 |
| 4,700,881 | A | * | 10/1987 | Ryan ........................ 228/194 |

* cited by examiner

*Primary Examiner* — Jerry Lorengo
*Assistant Examiner* — James E McDonough
(74) *Attorney, Agent, or Firm* — McNees Wallace & Nurick, LLC

(57) ABSTRACT

A method for joining a plurality of single crystal members includes providing a bonding foil with a composition match with that of the members and with a bonding temperature within the gamma prime solution temperature range of the members, but below the melting temperature of the foil and below the incipient melting temperature of the members. The foil is disposed between and in contact with opposing members to be joined while heated to and held at the bonding temperature for at least 10 hours.

9 Claims, No Drawings

METHOD FOR JOINING SINGLE CRYSTAL MEMBERS AND IMPROVED FOIL THEREFOR

This invention relates to joining of a plurality of single crystal members and, more particularly, to an improved method for such joining and an improved metallic foil used in such method.

BACKGROUND OF THE INVENTION

Technical advances in the design of components in the hotter-operating sections of gas turbine engines have produced increasingly complicated configurations to enhance the efficiency and performance. This is particularly the case with air-cooled parts such as hollow turbine blades. As a consequence, such parts have become very difficult and costly to manufacture.

One reported line of development describes fabrication of such complex parts from multiple members bonded at one or more junctures between them. Such bonding has been accomplished using intermediate or interlayer bonding materials, in the form of powders, coatings, shims, foils, etc., disposed between the members. The intermediate material is heated to a temperature which at least partially melts or liquefies such material to facilitate its diffusion between the opposing members being joined to produce a bonded joint. Associated with such reported methods are relatively high bonding temperatures required to bring about such melting so that relatively rapid interdiffusion and bonding can occur during part manufacture.

Further complicating such fabrication or bonding methods, are their attempted use in the joining of opposing members, each in the form of a single crystal. If the resultant bonded joint is multicrystalline or has a significant crystalline structural mismatch, for example, greater than approximately 5° with the opposing members, the joint can precipitate premature joint separation or failure, particularly in the transverse direction, within the relatively difficult environment and stress conditions experienced during gas turbine engine operation.

SUMMARY OF THE INVENTION

In one form, the present invention provides an improved method for joining a plurality of single crystal members. The method results in a single crystal article in which the crystal orientation in the juncture between the selected crystal members has a 5° mismatch or less. The method compromises the unique combination of: (a) providing an intermediate surface boronized bonding foil disposed between the single crystal members, the foil having a lower melting temperature at the boronized surface than at incrementally short distances away from the boronized surface, and having a composition matched with the composition of the members except for the higher boron content of the surface and a significantly lower content of gamma prime formers so as to increase foil ductility by reducing gamma prime content of the foil, bonding temperature selected to be substantially within the gamma prime solution temperature range of the members, but below both the melting temperature of the foil away from the boronized surface and the incipient melting temperature of the members, yet above the melting temperature of the boronized foil surface; (b) heating the single crystal members and the foil to the bonding temperature; and (c) holding an assembly of the foil between and in contact with opposing members at the bonding temperature for a relatively long diffusion time, greater than 10 hours, sufficient to enable the members to act as single crystal seeds, which grow epitaxially into the liquified foil. As the members grow into the foil, the foil is incorporated into the members. The relatively long, elevated, high temperature hold time allows solid state diffusion in the bonding foil and regions near the bonding foil, this region being referred to as the bond region or the joint region, thus providing solid state interdiffusion and providing the members with a single crystal continuum which has been strengthened through diffusion of strengthening elements from the members into the foil. The single crystal continuum is then aged at a selected aging temperature to produce a uniform gamma prime structure throughout the continuum.

In another form, the invention provides the above described foil, typically a nickel-based alloy, particularly if the members are nickel based alloys, having a boronized surface up to a total of about 0.4-1.5 wt. % of the foil composition.

DESCRIPTION OF THE PREFERRED EMBODIMENTS

In known processes for joining or bonding multiple members together at a butt-type joint, the resulting joint area included a weaker equiaxed grain structure or high angle grain boundaries. This occurrence was particularly significant when joining single crystal members. Reported single crystal studies have shown that the presence of grain boundaries with greater than 6° misfit or mismatch significantly reduces transverse stress rupture strength. Therefore, introduction of such grain boundaries into such a joint area using an equiaxed interlayer material can adversely affect the mechanical properties of fabricated single crystal articles operating in the hot, highly-stressed sections of gas turbine engines.

Contrary to such experience, the present invention describes a method for bonding single crystal members using an equiaxed foil as an interlayer to result in a joint area characterized by the absence of high-angle grain boundaries. This is accomplished by carefully adjusting and matching the composition of the foil and members with critical bonding process controls. The result is achievement of bond-joint properties that at least approach the single crystal alloy properties of the members which have been joined. The foil associated with the present invention has been defined to include the proper amount of gamma prime strengthening phase while being substantially free of undesirable second phases in its matrix and in grain boundaries.

During the evaluation of the present invention, a variety of combinations of member alloys and foil alloys were assembled and tested under various bonding process conditions. Mechanical and environmental testing was conducted on bonded members.

In a study, bonding blocks were machined from single crystal alloys, representing members, with the bond surface parallel to the <001> primary single crystal growth direction. A 0.003" thick surface boronized foil was placed between a pair of blocks to be joined, with application of a nominal load of 17 psi to the bond using a dead-weight loading fixture. This assembly was heated in vacuum at temperatures ranging from 2200 F.° to 2300 F.°, within the solution temperature range of the single crystal alloys, and held for bonding cycle times of between 0.5 to 20 hours. The composition of the single crystal alloys and the equiaxed bonding foils used in this study are shown in the following Table I.

TABLE I

| | Nominal Alloy Composition (weight percent plus incidental inpurities) | | | | | | | | | | | | | Calculated Gamma Prime Content (Vol %) | Calculated Incipient Melting Temp (° F.) | Calculated Gamma Prime Solution Temp (° F.) |
|---|---|---|---|---|---|---|---|---|---|---|---|---|---|---|---|---|
| | Co | Cr | Al | Ti | Ta | W | Mo | Hf | Zr | C | Y | B | Ni | | | |
| Member Alloys | | | | | | | | | | | | | | | | |
| 671 | 7.5 | 9.5 | 5.6 | 1.4 | 5.0 | 6.0 | 1.5 | 0.1 | — | — | — | — | Bal | 57 | 2366 | 2312 |
| 705 | 7.5 | 9.5 | 5.6 | 1.4 | 5.0 | 6.0 | 1.5 | 0 | — | 0.07 | 0.07 | — | Bal | 56 | 2366 | 2312 |
| Foil Alloys | | | | | | | | | | | | | | | | |
| A | 10 | 10 | 2.0 | 0 | 4.0 | 7.0 | 2.0 | 0 | — | — | — | (a) | Bal | 27 | 2404 | 2260 |
| B | 10 | 15 | 3.5 | 0 | 3.4 | — | — | — | — | — | — | (a) | Bal | 33 | 2314 | 2255 |

(a) Each foil was surface-boronized to levels from 0.7 to 1.5 weight percent of foil; however, the melting temperature of the boronized surface is unavailable.

The composition of the bonding foils shown in Table I have been matched in the strengthening elements Co, Cr and Ta (and in Alloy A, W and Mo) with the strengthening elements of the member alloy to retain high temperature strength. Concurrently, Al was reduced and Ti was eliminated. These elements, Al and Ti, are gamma prime formers, which diffuse easily. Additionally, when the sum of the elements Al and Ti is greater than about 4.0%, there is an increased likelihood of foil cracking during processing. Carbon, which tends to form undesirable second phases, particularly at grain boundaries, was also eliminated in the foil so that grain boundary effects in the foil can be eliminated. Because these elements readily diffuse, they are not desirable in the early stages of crystal growth into the foil.

However, after the long diffusion time at high temperatures, the amount of these strengthening elements in the foil region is substantially the same as in the starting member alloys. The surface of each foil was boronized so that the melting temperature of the foil surface is depressed below that of both the non-boronized foil surface and the members to be joined. These changes in foil composition resulted in about a 50% volume reduction in gamma prime content, facilitating foil manufacture through increase in ductility. Furthermore, reduction in these gamma prime forming elements were least likely to affect the strength of the finished bond joints since Al and Ti will easily diffuse into the joint area from the member alloys during the bonding cycle to provide joint area strength enhancement. Of particular interest as a preferred embodiment of the present invention is the combination and matching of member alloy 705 with foil alloy A, principally because of the inclusion of the strengthening elements W and Mo which do not readily diffuse, but which strengthen the foil alloy and match it more closely with the member alloys.

The bonding method developed with the above described combinations of alloys specifically used a temperature above the melting temperature of the boronized surface and a long-diffusion bonding time. This allowed the single crystal parent or member to act as a seed which first grows into the foil interlayer as the boronized surface melts, then homogenizes the joint region and the members. Epitaxial growth of the single crystal members initially occurs into the boronized surfaces of the foil. This growth continues into the foil as boron diffuses away from the surface into the foil, thereby lowering the melting temperature of the foil adjacent the surface, so further epitaxial growth occurs. This process continues until the entire foil is "consumed" or assimilated by the epitaxial growth into the members. Continued maintenance of the bonded workpiece at this elevated temperature for an extended period of time allows for diffusion, grain boundary annihilation via migration as well as homogenization of the gamma structure of the two single crystals into one. A single crystal joint was formed, indistinguishable from the structure of the joined members. As will be shown from data presented below, bonding times greater than 10 hours are required to accomplish such a result at temperatures below the incipient melting temperature of the member alloys and below the melting temperature of the foil alloy away from the boronized surfaces, but above the melting temperature of these surfaces. This combination of composition matching and bonding process control enables creation of a single crystal continuum at the bonding area through epitaxial growth and solid state diffusion.

During evaluation of the bonding method, bonding times of 2, 5, 10 and 20 hours were studied with the above described assemblies, at the solution temperature of the member alloy, the foil having a boronized surface. A micrographic evaluation showed the 2 hour and 5 hour bonding cycles produced joints that included discrete grains interconnected with a single grain boundary. At the 10 hour and 20 hour bonding cycle, the joint area appeared free of grain boundaries.

For the assembly of member alloy 705 with foil alloy A, the foil was boronized to provide the foil with 1.2 wt. % B. The bonding cycle was in vacuum at 2330 F.°; at about the gamma prime solution temperature of alloy 705. For the assembly of member alloy 705 with foil alloy B, the foil was boronized to provide the foil with 1.45 wt. % B. When another process cycle commonly used with the foil alloy B was tested (4 hours at 2200 F.° followed by 0.5 hours at 2300 F.°), an equiaxed grain structure was produced in the bonded joint area. Thus bonding within the solution temperature range of the member alloy and below the melting temperature of the boronized foil surfaces coupled with long diffusion times at elevated temperatures to homogenize and to eliminate crystallographic mismatch from the final structure are important features of the method of the present invention.

Stress rupture testing of the above described bonded assemblies was conducted at 2000 F.°. The following Tables II, III and IV present typical data from such testing.

TABLE II (Stress Rupture Testing at 2000° F. and 6000 psi of Member Alloy 705 and Foil Alloy A)

| EXAMPLE | BONDING ° F. | CYCLE HOURS | STRESS RUPTURE LIFE (HRS.) |
|---|---|---|---|
| A-3 | 2330 | 2 | 59 |
| A-3A | 2330 | 2 | 151 |
| A-16 | 2330 | 5 | 1143 (a) |
| A-16A | 2330 | 5 | 9 |

TABLE II-continued (Stress Rupture Testing at 2000° F. and 6000 psi of Member Alloy 705 and Foil Alloy A)

| EXAMPLE | BONDING ° F. | CYCLE HOURS | STRESS RUPTURE LIFE (HRS.) |
|---|---|---|---|
| A-17 | 2330 | 10 | 893 |
| A-4 | 2330 | 20 | 1265 |
| A-4A | 2330 | 20 | 334 |
| A-15 | 2330 | 20 | 1603 (a) |

(a) run out

TABLE III (Stress Rupture Testing at 2000° F. and 6000 psi of Member Alloy 705 and Foil Alloy B)

| EXAMPLE | BONDING ° F. | CYCLE HOURS | STRESS RUPTURE LIFE (HRS) |
|---|---|---|---|
| A-7 | 2200 | 4 | 0.9 |
| A-7A | 2200 then 2300 | 4 0.5 | 1.1 |
| A-14 | 2300 | 20 | 502 |
| A-14A | 2330 | 20 | 1150 (a) |

(a) run out

The stress rupture data presented in the above Table II and III show that the bonded joints produced by the present invention result in stress rupture lives approaching, and in general, exceeding baseline stress rupture lives for widely used turbine blade alloys 30 (typically 750 hours for Rene' 125 alloy). The data of Tables II, III and IV clearly show the significantly improved stress rupture life achieved with a bonding cycle of a least 10 hours, and particularly at 20 hours, at the solution temperature of the member alloys. Although there is some scatter in the stress rupture life data in Table II and Table IV, bonding cycle times greater than 10 hours produce generally superior stress rupture life. The present invention permits bonding of single crystal alloys and elimination of low angle grain boundaries in the joint region, while providing a homogeneous joint region having a composition substantially the same as the surrounding single crystal alloys.

The environmental resistance of an assembly provided by the present invention was evaluated in oxidation and hot corrosion testing. In one test, a ¼" diameter by 3" long bonded pin of member alloy 705 bonded with foil alloy A was used. High-velocity oxidation testing was conducted at Mach I air velocity with cyclic heating to 2150 F.° and rapid quenching to below 1000 F.°. In another test, specimens of that same bonded alloy assembly were hot-corrosion tested at 1600 F.° in an atmosphere of 1 ppm sea salt. No accelerated attack at the bond joint was observed after 590 hours of exposure.

Additional comparative environmental testing was conducted on the bonded assemblies of alloy 671 bonded with foil alloy A, and bonded assemblies of alloy 705 bonded with foil alloy A. This was done to determine the effect of rare earth elements, in this example, yttrium in member alloy 705 on such resistance. Low velocity (Mach 0.05) oxidation screening tests were conducted at 2150 F.° on such bonded assemblies. After 100 hours of testing, the assembly of alloy 671 (no yttrium) began to show general spalling of oxide scale along with accelerated attack of the bond-joint area. However, the assembly of alloy 705, including the bond joint area, showed no metal loss after 1000 hours of testing. Apparently, yttrium in member alloy 705 had diffused into the bond joint area during the bonding cycle, thereby providing better oxidation resistance. Therefore, according to the present invention, a preferred foil alloy includes Y, for example, in the range of about 0.01-0.3 wt. % Y. These accelerated environmental tests showed that the composition of the foil alloy associated with the present invention can be adjusted and matched further with that of the member alloy to enhance environmental resistance at high temperatures experienced in gas turbine engine operation.

Another series of evaluations were conducted with bonded assemblies of other member alloys and foil alloys, the compositions of which were modified primarily to enhance environmental resistance. Table V identifies the compositions of typical alloys used in this series. Specimens were bonded as described above, at a solution temperature of about 2330 F.° with a 20 psi dead-weight load and stress-rupture tested, using a 0.003" thick foil. Tables VI and VII present typical stress rupture data averaged from such testing. They show that the present invention provides assemblies, which at 10 and 20 hour processing with 0° mismatch to produce single crystal joints, have mechanical properties nearly equivalent to typical known turbine blade alloys, identified above.

TABLE IV (Stress Rupture Testing of Member Alloy 722 and Foil Alloy A Varying Bonding Time)

| BONDING TIME (HRS) | # OF SPECIMENS | 2000° F. AT 11 ksi AVERAGE STRESS RUPTURE LIFE (HRS) |
|---|---|---|
| 5 | 2 | 13 |
| 10 | 3 | 156 |
| 20 | 5 | 268 |

TABLE V

Nominal Alloy Composition (weight percent plus incidental inpurities)

| | Co | Cr | Al | Ti | Ta | W | Mo | Hf | Zr | C | Y | B | Re | Ni | Calculated Gamma Prime Content (Vol %) | Calculated Incipient Melting Temp (° F.) | Calculated Gamma Prime Solution Temp (° F.) |
|---|---|---|---|---|---|---|---|---|---|---|---|---|---|---|---|---|---|
| Member Alloys | | | | | | | | | | | | | | | | | |
| 722 | 7.5 | 9.5 | 5.6 | 1.4 | 5.0 | 6.0 | 1.5 | 0 | 0 | 0 | .02 | 0 | 0 | Bal | 57 | 2366 | 2312 |
| 768 | 7.5 | 9.5 | 5.6 | 1.4 | 5.0 | 6.0 | 1.5 | .15 | 0 | .05 | .01 | .004 | 0 | Bal | 56 | 2366 | 2312 |
| Rene' N5 | 7.5 | 7.0 | 6.2 | 0 | 6.5 | 5.0 | 1.5 | .15 | 0 | 0 | .01 | .004 | 3.0 | Bal | 57 | 2431 | 2381 |

TABLE V-continued

Nominal Alloy Composition (weight percent plus incidental impurities)

| | Co | Cr | Al | Ti | Ta | W | Mo | Hf | Zr | C | Y | B | Re | Ni | Calculated Gamma Prime Content (Vol %) | Calculated Incipient Melting Temp (° F.) | Calculated Gamma Prime Solution Temp (° F.) |
|---|---|---|---|---|---|---|---|---|---|---|---|---|---|---|---|---|---|
| | | | | | | | | | Foil Alloys | | | | | | | | |
| A | 10 | 10 | 2.0 | 0 | 4.0 | 7.0 | 2.0 | 0 | — | — | — | (a) | — | Bal | 27 | 2404 | 2260 |
| C | 10 | 10 | 2.0 | 0 | 4.0 | 7.0 | 2.0 | 0 | — | — | .015 | (a) | — | Bal | 27 | 2404 | 2260 |
| D | 10 | 14 | 2.0 | 2.0 | 4.0 | 7.0 | 2.0 | 0 | — | — | .15 | (a) | — | Bal | 37 | 2296 | 2162 |
| E | 10 | 14 | 2.0 | 2.0 | 2.0 | 7.0 | 2.0 | 0 | — | — | — | (a) | — | Bal | 34 | 2302 | 2160 |
| F | 10 | 10 | 2.0 | 0 | 4.0 | 7.0 | 2.0 | .15 | — | — | .015 | (a) | — | Bal | 28 | 2404 | 2260 |

(a) Each foil was surface-boronized to levels from 0.4 to 1.2 weight percent of the foil; however, the melting temperature of the foil is not known due to this treatment.

TABLE VI (Stress Rupture Testing of Member Alloy 722 and Foil Alloy A)

| | | | AVERAGE RUPTURE DATA | | |
|---|---|---|---|---|---|
| EXAMPLE | BOND TIME AT 2330° F. | CRYSTAL MISMATCH | TEMP (° F.) | ksi | LIFE (HRS) |
| 38 | 5 | 0 | 2000 | 11 | 26 |
| 25/35 | 10 | 0 | 2000 | 11 | 230 |
| 20/20A | 20 | 0 | 2000 | 11 | 358 |
| 29/30/31 | 20 | 40° | 2000 | 11 | 7 |
| 38A/38B/39 | 5 | 0 | 1600 | 60 | 294 |
| 35A/35B | 10 | 0 | 1600 | 60 | 440 |
| 29A/31B | 20 | 40° | 1600 | 60 | 226 |

TABLE VII (Stress Rupture Testing of Member Alloy 768 and Foil Alloy A)

| | | | AVERAGE RUPTURE DATA | | |
|---|---|---|---|---|---|
| EXAMPLE | BOND TIME AT 2330° F. | CRYSTAL MISMATCH | TEMP (° F.) | ksi | LIFE (HRS) |
| 42 | 20 | 0 | 2000 | 11 | 711 |
| 57/76 | 20 | 0 | 2000 | 15 | 105 |
| 47/47A | 20 | 5° | 2000 | 15 | 29 |
| 50/50A | 20 | 10° | 2000 | 15 | 14 |

At the above, described evaluation of the present invention, the 10 and 20 hour bonding times at the gamma prime solution temperature of the member alloys (in these examples about 2330 F.°) resulted in formulation of single crystal bond joints by epitaxial growth and grain boundary migration or dissolution, and chemical homogenization between the interlayer foil and the member material. Five hour bonding time again produced bond joints that included discrete grains interconnected with a grain boundary. Stress rupture specimens bonded with a controlled crystallographic orientation mismatch of 5°, 10° and 40° between member halves resulted in a grain boundary at the bond joint in addition to reduced stress rupture life.

In addition to the above described testing using a 0.003" thick foil, further similar testing using foils of a total thickness of 0.002", 0.006" and 0.009" was conducted as shown in Table VIII below. The results of such testing indicated that foil thickness up to about 0.01" would produce high strength single crystal bond joints, thereby relaxing the joint gap tolerance requirements for manufacture of articles. Therefore, foil thickness is selected based on joint gap size up to about 0.01".

TABLE VIII (Stress Rupture Testing of Member Alloy 768 and Foil Alloy A Varying Foil Thickness)
Bond Cycle: 2330° F./20 Hrs.
Stress Rupture Conditions: 2000° F. at 15 ksi

| Foil Thickness (Inches) | Average Stress Rupture Life (Hrs.) |
|---|---|
| 0.002 | 56 |
| 0.003 | 93 |
| 0.006 | 103 |
| 0.009 | 79 |

With reference to the above Table V, Y was added to foil alloy C to further improve oxidation resistance, as described above. Foil alloys D and E varied Cr, Ti and Ta to improve hot corrosion resistance and to increase gamma prime strengthening elements in the bonding foil. Foil alloy F included 0.15 wt. % Hf to match the Hf content of member alloys 768 and Rene'N5. Testing indicated that such modification had no pronounced affect on stress rupture properties. However, some oxidation resistance improvement was observed.

The effect of bond foil composition and process variations stress rupture performance on bonding Rene' N5 single crystals is provided in Table IX.

Another preferred single crystal member alloy referred to as Rene' N6 and described in co-pending U.S. application Ser. No. 07/459,400, incorporated herein by reference, has the following composition: 4-5% Cr, 11-14% Co, 4-8% W, 6-10% Ta, 5-7% Al, 5.5-8% Re, 0-0.5% Hf, 0-0.07% C, 0-0.01% B, 0-0.03% Y, 0-6% Ru, 0-1% Nb, 0-1% Mo and the balance Ni and incidental impurities.

A preferred foil alloy composition, in weight percent, consists essentially of about 5-15% Cr, 7-15% Co, 2-4% Al, 2-4% Ta, up to 7% W, up to 2% Mo with the balance Ni and incidental impurities. This preferred foil optionally includes 0.01-0.3% Y. The foil surface is boronized, the boron content of the foil surface being 0.5-1.5% of the foil composition.

The most preferred foil alloy composition is that of Alloy A, which is given in Table V, but additionally having up to 0.15% Y, added to improve oxidation resistance, and optionally up to 0.15% Hf, if needed to match the Hf content of the member alloys. The surface of the foil is boronized from 0.5-1.5% by weight of the foil composition.

After homogenizing the joined structure for at least 10 hours at about 2350° F., a gamma-gamma prime structure may be formed by any known conventional methods. For example, the joined structure may be cooled to the aging temperature, which includes the range of about 1900-2050° F., held at this aging temperature for about 4-16 hours, depending on part size, and then cooled to room temperature. This aging treatment will develop a uniformly-distributed gamma prime structure throughout the gamma matrix of the structure. Alternately, the joined matrix may be rapidly cooled to room temperature and then reheated to a desired temperature within the aging temperature range for the period of time required to form the desired gamma prime structure.

TABLE IX

Effect of Bond foil Composition and Process Variations on Stress Rupture of Bonded Alloy Rene' N5

| | Bonding Cycle | | Foil | | | Stress Rupture | | |
| --- | --- | --- | --- | --- | --- | --- | --- | --- |
| | | | | | Thickness | | | |
| Specimen | Temperature ° F. | Hours | Composition | Boron % | mils | Temperature ° F. | ksi | Life. Hours |
| 111 | 2385 | 5 | BA-1 | 0.8 | 3 | 2000 | 15 | 28 |
| 111A | 2385 | 5 | BA-1 | 0.8 | 3 | 2000 | 15 | 182 |
| 112 | 2385 | 10 | BA-1 | 0.8 | 3 | 2000 | 15 | 124 |
| 112A | 2385 | 10 | BA-1 | 0.8 | 3 | 2000 | 15 | 46 |
| 91 | 2385 | 20 | BA-1 | 0.8 | 3 | 2000 | 15 | 213 |
| 91A | 2385 | 20 | BA-1 | 0.8 | 3 | 2000 | 15 | 145 |
| 117 | 2390 | 20 | BA-1 | 0.4 | 3 | 2000 | 15 | 287 |
| 117A | 2390 | 20 | BA-1 | 0.4 | 3 | 2000 | 15 | 179 |
| 113 | 2385 | 20 | BA-1 | 0.8 | 3 | 2000 | 15 | 453 |
| 116 | 2390 | 20 | BA-1 | 0.8 | 3 | 2000 | 15 | 320 |
| 116A | 2390 | 20 | BA-1 | 0.8 | 3 | 2000 | 15 | 181 |
| 120 | 2390 | 20 | BA-1 | 1.2 | 3 | 2000 | 15 | 247 |
| 120A | 2390 | 20 | BA-1 | 1.2 | 3 | 2000 | 15 | 253 |
| 125* | 2390 | 20 | BA-1 | 0.8 | 3 | 2000 | 15 | 323 |
| 125A* | 2390 | 20 | BA-1 | 0.8 | 3 | 2000 | 15 | 524 |
| 135A | 2390 | 20 | BA-2 | 0.4 | 3 | 2000 | 15 | 478 |
| 136 | 2390 | 20 | BA-2 | 0.7 | 2 | 2000 | 15 | 392 |
| 136A | 2390 | 20 | BA-2 | 0.7 | 2 | 2000 | 15 | 600 |
| 134 | 2390 | 20 | BA-2 | 0.7 | 3 | 2000 | 15 | 452 |
| 134A | 2390 | 20 | BA-2 | 0.7 | 3 | 2000 | 15 | 380 |
| 130 | 2390 | 20 | BA-6 | 0.4 | 3 | 2000 | 15 | 514 |
| 130A | 2390 | 20 | BA-6 | 0.4 | 3 | 2000 | 15 | 352 |
| 131 | 2390 | 20 | BA-6 | 0.7 | 3 | 2000 | 15 | 365 |
| 131A | 2390 | 20 | BA-6 | 0.7 | 3 | 2000 | 15 | 387 |
| <010> | Rene' N5 (Baseline) | | | | | 2000 | 15 | 260 |

*40 psi bond pressure.

These data and examples and embodiments show the present invention as a significant improvement in the joining of single crystal alloy members to achieve a single crystal alloy member with no low angle grain boundaries. Those skilled in the art will recognize and appreciate that such examples and embodiments are typical of, rather than in any way limiting in the scope of the present invention as requested by the appended claims.

The invention claimed is:

1. A method of joining a plurality of single crystal members with a juncture between them, including selecting the members to have, at the juncture, a crystal orientation mismatch of less than about 5° therebetween, the members further having substantially the same gamma prime solution temperature range, incipient melting temperature range, and having related compositions, with the members being placed in juxtaposition with a bonding foil disposed at the juncture therebetween, with each member in contact with the foil to provide an assembly, comprising the steps of:
   a) providing the bonding foil with a composition matched with the composition of the members except for a lower content of gamma prime formers, so that a significantly lower gamma prime content in the foil increases foil ductility, the foil
      i) having a foil body with a first melting temperature within the incipient melting temperature range of the members, and at least one boronized surface having a second melting temperature which is lower than the first melting temperature, the second temperature being substantially within the gamma prime solution temperature range of the members, but below the incipient melting temperature range of the members at the juncture, and
      ii) the boronized surface having a boron content in an amount up to a total of about 0.4-1.5 wt. % B of the foil composition;
   b) bonding the assembly by heating the assembly to the second temperature; and
   c) holding the assembly at the second temperature for at least 10 hours, sufficient to enable the members at the juncture to act as single crystal seeds, to progressively grow epitaxially into the foil to form a joint region, and thereafter to chemically homogenize the joint region by interdiffusion and to crystallographically orient the joint region by grain boundary migration, providing at the juncture a strengthened single crystal continuum.
   d) aging the single crystal continuum at a selected aging temperature for a selected time so that a uniform gamma prime content is produced throughout the continuum.

2. The method of claim 1 in which:
   a) the single crystal members are nickel-based alloys, and
   b) the bonding foil is a nickel base alloy having a lower content of gamma prime forming elements than the members.

3. The method of claim 2 in which the foil:
   a) has a composition by weight percent of about 5-15% Cr, 7-15% Co, 2-4% Al, 2-4% Ta, up to 7% W, up to 2% Mo, 0.01-0.3% Y, with the balance Ni and incidental impurities; and
   b) further includes a boronized surface in an amount up to a total of about 0.5-1.5 wt. % of the foil composition.

4. The method of claim 1 in which the step of holding the assembly at the second temperature includes holding the assembly at the second temperature for about 10 to 20 hours.

5. An improved metallic foil for joining a plurality of single crystal members of predetermined compositions together, having a gamma prime solution temperature range, the foil:
   a) having a composition matched with the compositions of the members except for a significantly lower content of elements which function as gamma prime formers;
   b) having a foil body, the body having a first melting temperature which is substantially within the incipient melting temperature range of the members; and
   c) having at least one boronized surface, the surface having a second melting temperature below the first melting temperature, but within the gamma prime solution temperature of the members, the surface having an amount of boron up to a total of about 0.5-1.5 wt. % of the foil composition.

6. The foil of claim 5 in which:
   a) the metallic foil and single crystal members each are nickel-based alloys; and
   b) the foil has a gamma prime content by volume of at least about one-half of the gamma prime content by volume of the members.

7. The foil of claim 6 in which:
   a) the foil composition in weight percent consists essentially of about 5-15% Cr, 7-15% Co, 2-4% Al, 2-4% Ta, up to 7% W, up to 2 Mo, with the balance Ni and incidental impurities; and
   b) the foil further includes a boronized surface in an amount up to a total of about 0.5-1.5 wt. % of the foil composition.

8. The foil of claim 6 further including about 0.01-0.3% Y.

9. The foil of claim 6 in which:
   a) the foil composition in weight percent consists essentially of about 10% Cr, 10% Co, 7% W, 4% Ta, 2% Al, 2% Mo, optionally up to about 0.15% Hf, optionally up to about 0.15% Y, with the balance Ni and incidental impurities; and
   b) the foil further includes a boronized surface in an amount up to a total of about 0.5-1.5 wt. % of the foil composition.

* * * * *